(12) United States Patent
Suehiro et al.

(10) Patent No.: US 8,294,160 B2
(45) Date of Patent: Oct. 23, 2012

(54) LIGHT EMITTING DEVICE INCLUDING A SEALING PORTION, AND METHOD OF MAKING THE SAME

(75) Inventors: Yoshinobu Suehiro, Aichi-ken (JP); Seiji Yamaguchi, Aichi-ken (JP)

(73) Assignee: Toyoda Gosei Co., Ltd., Aichi-Ken (JP)

( * ) Notice: Subject to any disclaimer, the term of this patent is extended or adjusted under 35 U.S.C. 154(b) by 0 days.

(21) Appl. No.: 12/929,331

(22) Filed: Jan. 14, 2011

(65) Prior Publication Data

US 2011/0104834 A1  May 5, 2011

Related U.S. Application Data

(62) Division of application No. 11/334,745, filed on Jan. 19, 2006, now abandoned.

(30) Foreign Application Priority Data

Jan. 20, 2005 (JP) .................. 2005-012810
Feb. 3, 2005 (JP) .................. 2005-027484

(51) Int. Cl.
*H01L 27/15* (2006.01)

(52) U.S. Cl. ................ 257/79; 257/81; 257/99; 438/22; 438/24

(58) Field of Classification Search .......... 257/100, 257/633, 634, 635, 644, 650, 794, E21.502, 257/E21.503, E23.118, E23.192, 79, 81, 257/98, 99; 438/26, 108, 124, 126, 127, 438/22, 24, 29, 64, 65
See application file for complete search history.

(56) References Cited

U.S. PATENT DOCUMENTS

| | | | |
|---|---|---|---|
| 5,813,753 A | 9/1998 | Vriens et al. | |
| 5,959,316 A | 9/1999 | Lowery | |
| 6,707,247 B2 | 3/2004 | Murano | |
| 2002/0185966 A1 | 12/2002 | Murano | |
| 2003/0214233 A1 | 11/2003 | Takahashi et al. | |
| 2003/0214616 A1* | 11/2003 | Komoto et al. | 349/96 |
| 2004/0041222 A1 | 3/2004 | Loh | |
| 2004/0046242 A1 | 3/2004 | Asakawa | |
| 2004/0135504 A1 | 7/2004 | Tamaki et al. | |
| 2004/0169466 A1 | 9/2004 | Suehiro et al. | |
| 2004/0207998 A1* | 10/2004 | Suehiro et al. | 362/84 |

(Continued)

FOREIGN PATENT DOCUMENTS

EP    1574558 A1 *    9/2005

(Continued)

OTHER PUBLICATIONS

Japanese Office Action dated Apr. 19, 2011, with partial English translation.

(Continued)

*Primary Examiner* — Richard Elms
*Assistant Examiner* — Harry W Byrne
(74) *Attorney, Agent, or Firm* — McGinn IP Law Group, PLLC

(57) ABSTRACT

A method of making a light emitting device, includes a mounting and a light emitting element on a substrate; hot-pressing a glass material on the light emitting element to form a glass sealing portion for sealing the light emitting element; and forming a phosphor layer on a surface of the glass sealing portion.

19 Claims, 15 Drawing Sheets

U.S. PATENT DOCUMENTS

| | | |
|---|---|---|
| 2005/0032257 A1 | 2/2005 | Camras et al. |
| 2005/0161771 A1 | 7/2005 | Suehiro et al. |
| 2005/0173708 A1 | 8/2005 | Suehiro et al. |
| 2006/0012299 A1 | 1/2006 | Suehiro et al. |
| 2006/0261364 A1 | 11/2006 | Suehiro et al. |

FOREIGN PATENT DOCUMENTS

| | | |
|---|---|---|
| JP | 62-153178 | 7/1987 |
| JP | 11-177129 | 7/1999 |
| JP | 2000-077723 | 3/2000 |
| JP | 2000-77723 A | 3/2000 |
| JP | 2001-501380 | 1/2001 |
| JP | 2002-368286 | 12/2002 |
| JP | 2003-197977 A | 7/2003 |
| JP | 2003-324215 A | 11/2003 |
| JP | 2004-031843 | 1/2004 |
| JP | 2004-207367 | 7/2004 |
| JP | 2004-221619 | 8/2004 |
| JP | 2004-296999 A | 10/2004 |
| WO | WO 2004/021461 | 3/2004 |
| WO | WO 2004/082036 | 9/2004 |
| WO | WO 2004/082036 A1 | 9/2004 |

OTHER PUBLICATIONS

Japanese Office Action dated Nov. 2, 2010 with a partial English translation.

Japanese Office Action dated Nov. 4, 2009 with a partial English translation.

\* cited by examiner

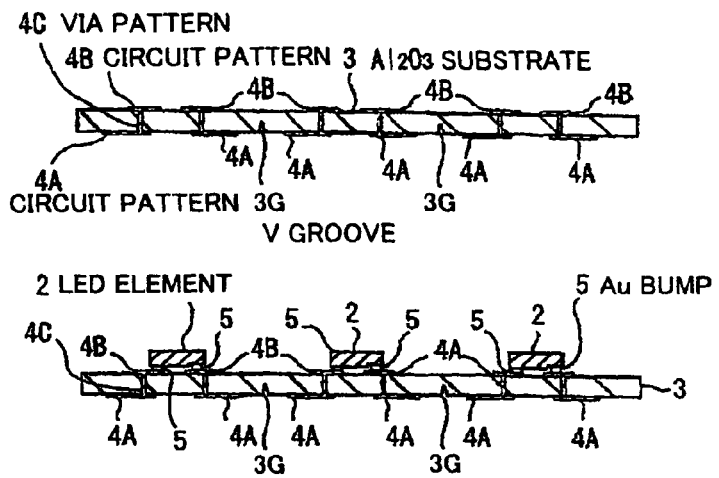
FIG. 2A
FIG. 2B
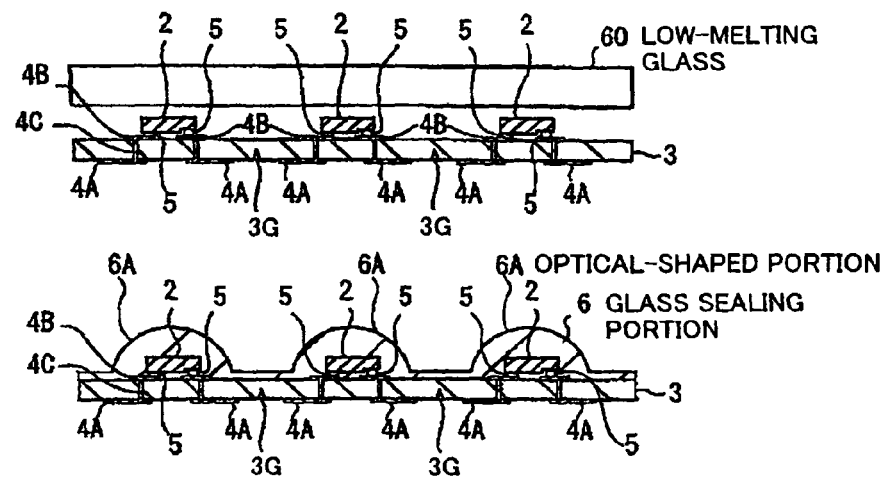
FIG. 2C
FIG. 2D
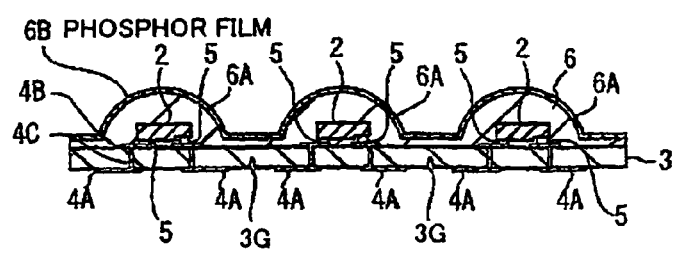
FIG. 2E

LIGHT EMITTING DEVICE INCLUDING A SEALING PORTION, AND METHOD OF MAKING THE SAME

RELATED APPLICATIONS

The present application is a Divisional application of U.S. patent application Ser. No. 11/334,745 which was filed on Jan. 19, 2006 now abandoned.

The present application is based on Japanese patent application Nos. 2005-012810 and 2005-027484, the entire contents of which are incorporated herein by reference.

BACKGROUND OF THE INVENTION

1. Field of the Invention

This invention relates to a wavelength-conversion type light emitting device to wavelength-convert a light emitted from a light emitting element and, in particular, to a wavelength-conversion type light emitting device that is excellent in reliability, stable in brightness over a long term, and excellent in unevenness of emission color.

Further, this invention relates to a light emitting device that the light emitting element is sealed with a glass sealing material and, in particular, to a light emitting device that is excellent in mass productivity, in sealing property and deterioration resistance under a high-temperature and high-humidity environment, and in evenness of emission color.

Further, this invention relates to a method of making the above light emitting device.

2. Description of the Related Art

A light emitting device is conventionally known that uses an LED (light emitting diode) element as a light source. In recent years, such a light emitting device is in wide use for an automobile lighting apparatus, a backlight light source in LCD devices, a lamp in small electronic device etc., and the other uses are also promising.

A semiconductor light emitting device is proposed that white light is radiated by wavelength-converting a light emitted from the LED element by a phosphor (e.g., JP-A-2004-221619, [0009], [0014] and FIG. 1 thereof)

The semiconductor light emitting device in JP-A-2004-221619 comprises an LED with a lens-shaped resin sealing portion, and a transparent phosphor cover which is disposed around the resin sealing portion. The LED is a GaN-based semiconductor light emitting element which has an emission peak in 430 to 480 nm. The phosphor cover comprises a thin-film resin which has an elasticity to be in close contact with the resin sealing portion, and a phosphor which radiates a fluorescent light by being excited by light emitted from the semiconductor light emitting element.

The semiconductor light emitting device in JP-A-2004-221619 is advantageous in that a desired emission color with high brightness can be obtained by mixing a light emitted from the semiconductor light emitting element with a light wavelength-converted by the phosphor since the phosphor cover is disposed around the resin sealing portion.

However, the semiconductor light emitting device in JP-A-2004-221619 has the following problems.

(1) It is difficult to secure its long-term reliability since the resin sealing portion and the phosphor cover deteriorate due to the light emitted from the GaN-based semiconductor light emitting element. Further, the brightness of the light emitting device lowers due to the deterioration.

(2) The profile accuracy of the phosphor cover and the uniformity of phosphor dispersed must be enhanced in consideration of the unevenness in emission color and the light distribution property since the light radiation characteristics of the semiconductor light emitting device are dependent on the shaping property of the resin sealing portion and the phosphor cover. Therefore, the manufacturing process will be complicated and the manufacturing cost will increase.

On the other hand, a resin-sealed type LED is conventionally known that an LED element is sealed with a transparent resin material such as an epoxy resin.

It is known that the resin-sealed type LED is subjected to a deterioration such as yellowing when the transparent resin material is reacted with intense light while it is excellent in sealing workability due to using the transparent resin material. Especially in using a group III nitride-based compound semiconductor light emitting element to emit short-wavelength light, the transparent resin material near the element can be yellowed due to high-energy light emitted from the element and heat generated from the element. Therefore, the light extraction efficiency may lower significantly.

To prevent the deterioration of the sealing material, a light emitting device is proposed that uses a low-melting glass as the sealing material (e.g., JP-A-11-177129, [0007] and FIG. 1 thereof).

FIG. 15 is a cross sectional view showing the light emitting device disclosed in JP-A-11-177129. The light emitting device 50 comprises an LED element 51, a printed-circuit board 52, a wiring pattern 53 formed on the surface of the printed-circuit board 52, a wire 54 which electrically connects between the LED element 51 and the wiring pattern 53, and the low-melting glass 55 which seals the LED element 51 and the wire 54, and has a refractive index of about 2 which is near 2.3 or so, the refractive index of a GaN-based LED element.

The light emitting device in JP-A-11-177129 is advantageous in that a light returned to the inside of the LED element 51 due to total reflection on the surface thereof can be reduced by sealing the LED element 51 with the low-melting glass 55 which has a refractive index close to that of the GaN-based LED element. Thus, the amount of light entering into the low-melting glass 55 after being emitted from the LED element 51 can be increased. As a result, the light extraction efficiency can be enhanced as compared to the conventional device with the LED element sealed with the epoxy resin.

However, the light emitting device in JP-A-11-177129 has problems in practical manufacturing and mass productivity since the low-melting glass cannot be easy processed like the epoxy resin.

For example, when the LED element is sealed with the glass in high-viscosity state so as to prevent the heat damage of the LED element, the wire may be deformed by the high-viscosity glass so that the electrical short-circuiting or the disconnection of wire may occur. Even when using the glass in low-viscosity state, the molding as shown in FIG. 15 is difficult to conduct. On the other hand, a resin printed-circuit board cannot endure the processing temperature, and an inorganic printed-circuit board may be broken when being pressed by a mold. Further, since the glass-sealed LED element requires an individual processing, not a batch processing due to the high-temperature processing, it cannot be applied to the mass production.

As described above, a phosphor white LED with a good long-term reliability is never proposed, and a glass-sealed LED with a good mass productivity is never proposed.

SUMMARY OF THE INVENTION

It is an object of the invention to provide a light emitting device that is excellent in long-term reliability so that the brightness can be stabilized over a long term, and excellent in evenness of emission color.

It is a further object of the invention to provide a light emitting device that is excellent in mass productivity, in sealing property and deterioration resistance under a high-temperature and high-humidity environment, and in evenness of emission color.

It is a further object of the invention to provide a method of making the light emitting device.

(1) According to one aspect of the invention, a light emitting device comprises:
   a flip-mounting type light emitting element;
   a substrate on which the light emitting element is mounted, the substrate comprising an inorganic material;
   a sealing portion to seal the light emitting element, the sealing portion comprising an inorganic sealing material;
   an optical-shaped portion formed nearly semispherical, the optical-shaped portion comprising the inorganic sealing material; and
   a phosphor portion formed covering the optical-shaped portion.

(2) According to another aspect of the invention, a light emitting device comprises:
   a flip-mounting type light emitting element;
   a substrate on which the light emitting element is mounted, the substrate comprising an inorganic material;
   a sealing portion to seal the light emitting element, the sealing portion comprising an inorganic sealing material;
   an optical-shaped portion formed nearly semispherical, the optical-shaped portion comprising the inorganic sealing material; and
   a phosphor portion formed covering the optical-shaped portion,
   wherein the inorganic material comprises a thermal expansion coefficient equivalent to that of the light emitting element, and
   the inorganic sealing material comprises a thermal expansion coefficient equivalent to that of the substrate and the light emitting element.

In the above invention (1) or (2), the following modifications and changes can be made.
   (i) The inorganic sealing material comprises a glass material.
   (ii) The phosphor portion comprises an inorganic material and a phosphor.
   (iii) The phosphor portion comprises a thermal expansion coefficient greater than the sealing portion.
   (iv) The phosphor portion comprises a dichroic mirror that a plurality of materials with different refractive indexes are alternately laminated, and a phosphor layer formed on the dichroic mirror.
   (v) The phosphor portion comprises a low-melting fluoride glass.
   (vi) The optical-shaped portion comprises a dimension to define a ratio to a width of the light emitting element of 2½ or more and 10 or less.

(3) According to another aspect of the invention, a light emitting device comprises:
   a light emitting element;
   a substrate on which the light emitting element is mounted, the substrate comprising an inorganic material;
   a sealing portion to seal the light emitting element, the sealing portion comprising an inorganic sealing material; and
   a coating portion formed covering the sealing portion,
   wherein the sealing portion comprises a cutting face at which an interface of the inorganic sealing material and the substrate is exposed and by which the light emitting element is surrounded, and
   the sealing portion is covered with the coating portion on an entire surface thereof.

(4) According to another aspect of the invention, a light emitting device comprises:
   a light emitting element;
   a substrate on which the light emitting element is mounted, the substrate comprising an inorganic material;
   a sealing portion to seal the light emitting element, the sealing portion comprising an inorganic sealing material; and
   a coating portion formed covering the sealing portion,
   wherein the sealing portion comprises a cutting face by which the light emitting element is surrounded, and
   the sealing portion is covered with the coating portion on an entire surface thereof that light emitted from the light emitting element reaches directly.

In the above invention (3) or (4), the following modifications and changes can be made.
   (vii) The light emitting element comprises a flip-mounting type light emitting element, and
   the substrate comprises the inorganic material that comprises a thermal expansion coefficient equivalent to that of the sealing portion.
   (viii) The coating portion comprises a light-transmitting inorganic material.
   (ix) The coating portion comprises a phosphor-containing material.
   (x) The coating portion comprises a dichroic mirror.

(5) According to another aspect of the invention, a method of making a light emitting device comprises:
   a first step that a substrate comprising an inorganic material is provided;
   a second stet that a plurality of light emitting elements are mounted on the substrate;
   a third step that the substrate with the plurality of light emitting elements mounted thereon is sealed with a sealing material;
   a fourth step that a cutting portion is provided in the sealing material;
   a fifth step that a coating is formed on a surface of the sealing material including an exposed portion formed by providing the cutting portion; and
   a sixth step that the substrate with the sealing material is separated along the cutting potion.

In the above invention (5), the following modifications and changes can be made.
   (xi) The coating in the fifth step is formed by sputtering.
   (xii) The coating in the fifth step is formed by electrostatic coating.

Advantages of the Invention

According to the invention, since the light emitting element and the substrate both made of the inorganic material are sealed with the inorganic sealing material, the sealing property and reliability can be enhanced. Further, deterioration caused by light emitted from the light emitting element can be suppressed, and a stable brightness can be kept without unevenness in emission color over a long term.

Furthermore, since the sealing portion and the substrate are covered with the light-transmitting inorganic coating portion, the water resistance of the sealing portion can be enhanced and a good adhesion between the substrate and the sealing portion can be secured. Further, even in high humidity environment, it can have a good sealing property, and deterioration resistance.

BRIEF DESCRIPTION OF THE DRAWINGS

The preferred embodiments according to the invention will be explained below referring to the drawings, wherein:

FIGS. 2A to 2E are cross sectional views showing a method of making the LED in the first embodiment;

DETAILED DESCRIPTION OF THE PREFERRED EMBODIMENTS

First Embodiment

Figure 1A:
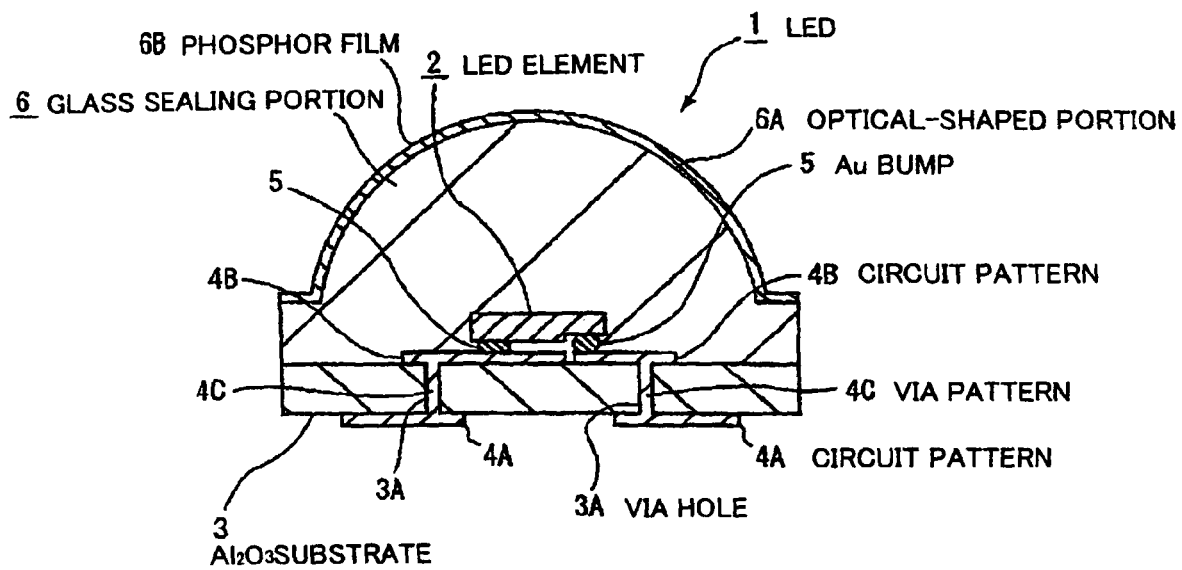
FIG. 1A is a cross sectional view showing a light emitting device (herein also called LED) in a first preferred embodiment according to the invention.
Figure 1B:
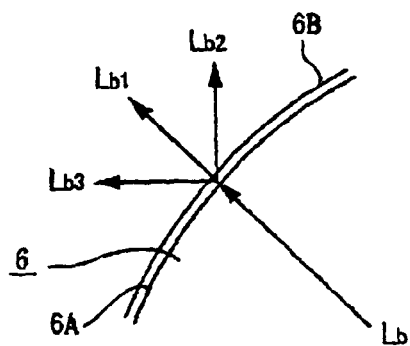
FIG. 1B is a schematic diagram illustrating light radiation on the surface of a glass sealing portion.

FIG. 1A is a cross sectional view showing a light emitting device in the first preferred embodiment according to the invention. FIG. 1B is a schematic diagram illustrating light radiation on the surface of a glass sealing portion.

(Components of the Device)

As shown in FIG. 1A, the LED 1 comprises: a flip-chip type LED element 2; an $Al_2O_3$ substrate 3, as an inorganic material substrate, provided with circuit patterns 4A, 4B, and via holes 3A; an Au bump 5 to electrically connect between the circuit pattern 4B and an electrode of the LED element 2; and a glass sealing portion 6 that is made of an inorganic sealing material to seal the $Al_2O_3$ substrate 3 and the LED element 2 and is provided with an optical-shaped portion 6A formed semispherical.

(Details of the Components)

The LED element 2 comprises, sequentially grown on an underlying sapphire substrate, an AlN buffer layer and a GaN-based semiconductor layer including an n-GaN layer, a light-emitting layer, and a p-GaN layer. It has a horizontal type electrode structure that a part of the n-GaN layer is exposed as an n-electrode formation region by etching the p-GaN layer through the n-GaN layer. It is flip-chip mounted on the circuit pattern 4B through the Au bump 5. The LED element 2 has a central emission wavelength of about 470 nm and a thermal expansion coefficient of $7 \times 10^{-6}/°C$. The ratio of the width of the optical-shaped portion 6A of the LED 1 and the width (i.e., the maximum width, the length of a diagonal line in case of a square) of the LED element 2 is determined to be 2½ or more and 10 or less.

The $Al_2O_3$ substrate 3 has a thermal expansion coefficient of $7 \times 10^{-6}/°C$., which is nearly equivalent to that of the LED element 2. It is provided with the circuit patterns 4A, 4B and the via pattern 4C which are made of tungsten (W)-nickel (Ni)-gold (Au).

The glass sealing portion 6 is made of low-melting glass which can be processed by hot pressing at a low melting point of 600° C. or less, and it has a thermal expansion coefficient ($7 \times 10^{-6}/°C$.) nearly equivalent to that of the LED element 2 and the $Al_2O_3$ substrate 3. It is, on its surface, provided with the optical-shaped portion 6A which is formed semispherical, and a phosphor film 6B which is formed, as a phosphor portion, on the surface of the optical-shaped portion 6A.

The phosphor film 6B is formed by coating an acrylic coating material containing Ce:YAG (yttrium aluminum garnet) phosphor on the surface of the optical-shaped portion 6A and then drying it. As shown in FIG. 1B, light Lb reaching the phosphor film 6B while transmitting the glass sealing portion 6 is irradiated to the phosphor and, thereby, yellow lights Lb1 to Lb3 are radiated from the phosphor.

(Method of Making the LED 1)

A method of making the LED 1 of the first embodiment will be described below.

FIGS. 2A to 2E are cross sectional views showing the method of making the LED 1 in the first embodiment. Hereinafter, the $Al_2O_3$ substrate 3 is used which is previously provided with a V groove 3G for separation and a via hole.

(Wiring Formation Step)

As shown in FIG. 2A, a W paste is screen-printed on the $Al_2O_3$ substrate 3 according to the circuit pattern. Then, the $Al_2O_3$ substrate 3 with the W paste printed thereon is heated at 1500° C. to burn the W onto the $Al_2O_3$ substrate 3. Then, Ni plating and Au plating are provided on the W to form the circuit patterns 4A, 4B and the via pattern 4C.

(LED Element Mounting Step)

Then, as shown in FIG. 2B, the LED element 2 is flip-mounted through the Au bump 5 on the circuit pattern 4B of the $Al_2O_3$ substrate 3.

(Low-Melting Glass Preparation Step)

Then, as shown in FIG. 2C, a plate-like $P_2O_5$—ZnO—$Li_2O$-based low-melting glass 60 is parallel placed over the $Al_2O_3$ substrate 3.

(Glass Sealing Step)

Then, as shown in FIG. 2D, the low-melting glass 60 is hot-pressed at 550 to 500° C. in a nitrogen atmosphere. The low-melting glass 60 is bonded to the surface of the substrate through oxides contained in the $Al_2O_3$ substrate 3 and the glass, and the glass sealing portion 6 is molded to have the semispherical optical-shaped portion 6A according to the form of a pressing mold.

(Phosphor Film Formation Step)

Then, as shown in FIG. 2E, with the plural LED's 1 formed in an array, the phosphor-containing acrylic coating material is coated on the surface of the glass sealing portion 6 and then dried to form the phosphor film 6B on the surface of the glass sealing portion 6.

Then, the LED 1 is separated by cutting the $Al_2O_3$ substrate 3 along the V groove 3G.

(Operation of the LED 1)

The operation of the first embodiment will be described below.

When current is fed through the circuit pattern 4A from a power supply (not shown), the light-emitting layer is current-fed through the electrode of the LED element 2. Thereupon, the light-emitting layer emits blue light. The blue light is inputted from the GaN-based semiconductor layer through the sapphire substrate to the glass sealing portion 6, reaching the optical-shaped portion 6A. The blue light reaching the optical-shaped portion 6A is then inputted to the phosphor film 6B. Thereupon, the phosphor contained in the phosphor film 6B radiates yellow light while being excited by the inputted blue light. Thereupon, white light is generated by mixing the yellow light with the blue light, and externally radiated from the phosphor film 6B.

(Effects of the First Embodiment)

The effects of the first embodiment are as follows.

(1) Since the LED element 2 is sealed with the glass sealing portion 6 with the semispherical optical-shaped portion 6A, deterioration in the sealing material due to the self-heating or self-irradiating of the LED element 2 does not occur so that the LED 1 can have an excellent sealing property of the LED element 2 and a stable brightness over a long term. Further, the bonding strength between the glass sealing portion 6 and the $Al_2O_3$ substrate 3 can be enhanced since they have an equivalent thermal expansion coefficient each other, different from the case of using the resin sealing material. Thus, the small LED 1 can be obtained with a high reliability.

(2) The phosphor film 6B is disposed at a suitable distance from the light extracting surface (i.e., bottom of the sapphire substrate) of the LED element 2, and the phosphor film 6B is provided with a uniform thickness. Thereby, even in case of the downsized LED 1, unevenness in emission color can be prevented as compared to the case of a phosphor-dispersed type which is likely to have unevenness in emission color caused by a difference in optical path length inside the phosphor layer. For example, in the phosphor-dispersed type, light with a long optical path length is shifted to yellow since it has a long distance to transmit the phosphor layer, and light with a short optical path length is likely to be blue since it has a short distance to transmit the phosphor layer. Thus, in this embodiment, the difference in optical path length can be substantially removed by forming the uniform thin-film phosphor layer on the surface of the optical-shaped portion 6A.

The optical-shaped portion 6A is formed nearly semispherical so as to allow the suitable distance from the LED element 2 to the phosphor film 6B so that lights emitted from the LED element 2 in any directions have a substantially even incident angle, around the perpendicular incident angle, to the optical-shaped portion 6A. By configuring thus, interface reflection loss at the optical-shaped portion 6A can be minimized such that light reflected on the surface of the optical-shaped portion 6A or on the phosphor film 6B is absorbed again by the LED element 2. Further, since the incident angle to the phosphor film 6B can be substantially uniformed, unevenness in emission color can be prevented. Further, since unevenness in emission color or reduction in light extraction efficiency can be prevented even in case of the downsized LED 1, the amount of phosphor used can be reduced and, thereby, the manufacturing cost can be reduced.

(3) The phosphor film 6B can be formed by coating the phosphor-containing acrylic coating material on the plural LED's 1 disposed on the substrate. Thus, the good phosphor film 6B can be formed together on the plural LED's 1 to enhance the productivity. Further, since the acrylic resin is excellent in light resistance, deterioration in the phosphor film 6B can be prevented.

Although in the first embodiment the LED 1 is separated through the V groove 3G formed on the $Al_2O_3$ substrate 3, the LED 1 may be diced by using a dicer.

The LED element 2 mounted on the $Al_2O_3$ substrate 3 may be a GaP-based or GaAs-based LED element other than the GaN-based LED element.

The phosphor can be chosen from phosphors to be excited by the emission wavelength of an LED element used.

The optical-shaped portion 6A is intended not to focusing of light but to external light radiation with high efficiency and good evenness in emission color. If the focusing characteristic is required, a focusing optical system can be provided such that the LED 1 is further resin-molded.

The ratio of the width of the optical-shaped portion 6A and the width of the LED element 2 is preferably 5 or less although it depends on the sealing material, the bonding strength to the substrate and the damage under processing conditions etc.

Second Embodiment

Figure 3:
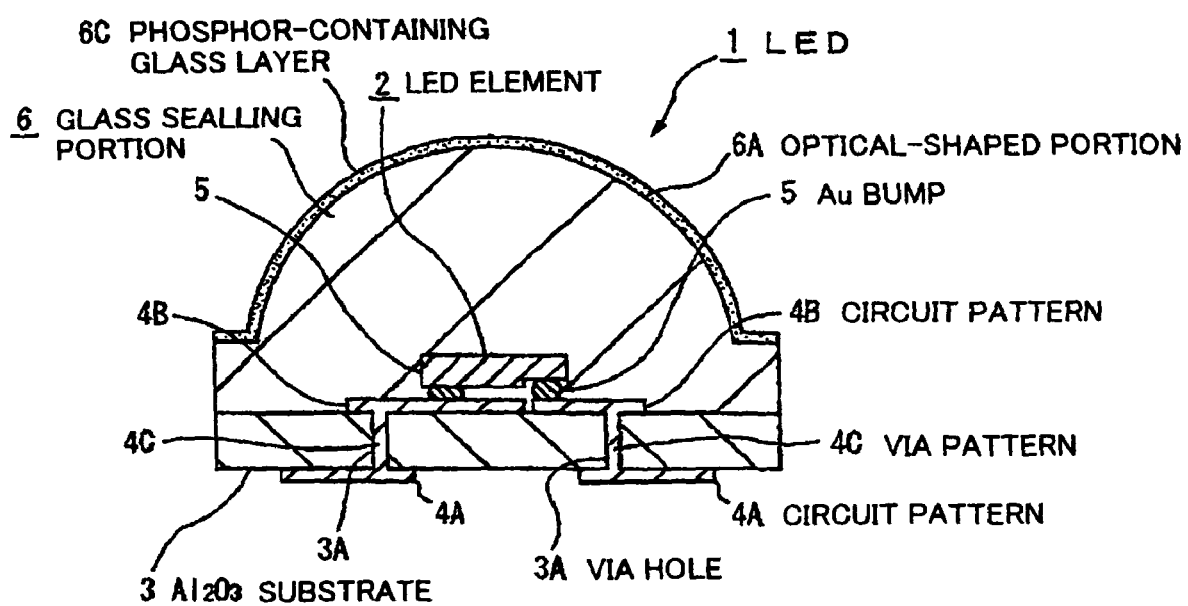
FIG. 3 is a cross sectional view showing a light emitting device in a second preferred embodiment according to the invention.

FIG. 3 is a cross sectional view showing a light emitting device in the second preferred embodiment according to the invention. Hereinafter, like components are indicated by the same numerals used in the first embodiment.

(Components of the Device)

The LED 1 of the second embodiment is different from that of the first embodiment in that a phosphor-containing glass layer 6C is used in place of the phosphor film 6B of the first embodiment.

(Details of the Components)

The phosphor-containing glass layer 6C is made of a mixture material (with a melting point of about 300° C.) that a phosphor particle with an average outside diameter of 10 μm is mixed with a fluoride low-melting glass particle with an average outside diameter of 10 μm. The phosphor-containing glass layer 6C is formed integrally on the surface of the glass sealing portion 6 with the optical-shaped portion 6A by conducting the electrostatic coating of the mixture material while heating the glass sealing portion 6 at 300° C. and applying a voltage thereto and then heating it at 350° C.

(Effects of the Second Embodiment)

In the second embodiment, since it is glass-sealed, the electrostatic coating can be conducted by applying the voltage thereto while heating it. Further, since the mixture material of the phosphor particle and the fluoride low-melting glass particle is electrostatically adhered to the surface of the glass sealing portion 6, an effect other than the effects of the first embodiment can be obtained that the mixture material can be, with a uniform film thickness, adhered to the uneven surface of the glass sealing portion 6 and the phosphor-containing glass layer 6C with a uniform thickness can be easy formed by fusion bonding. Further, since the fluoride coating of fluoride low-melting glass is formed on the surface of the glass sealing portion 6, the humidity resistance of the LED 1 can be further enhanced.

Glass materials are likely to be cracked due to difference of thermal expansion coefficient. However, since the fluorine low-melting glass with a thermal expansion coefficient greater than the glass sealing portion 6 is adhered onto the semispherical glass sealing portion 6, stress in a direction likely to cause the cracking can be suppressed when it is cooled to room temperature from the melted state free of stress. Namely, it is composed such that only compressive stress is generated except tensile stress and shear stress. In this regard, the fluorine low-melting glass with the phosphor particle contained therein needs to have a thermal expansion coefficient greater than the glass sealing portion 6.

Third Embodiment

Figure 4:
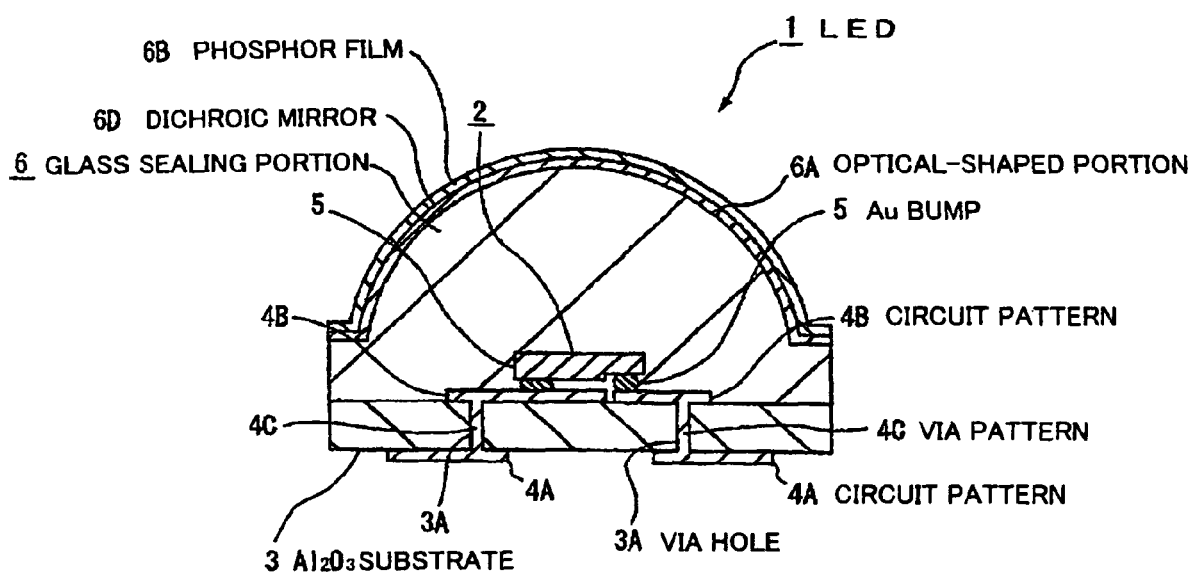
FIG. 4 is a cross sectional view showing a light emitting device in a third preferred embodiment according to the invention.

FIG. 4 is a cross sectional view showing a light emitting device in the third preferred embodiment according to the invention.
(Components of the Device)

The LED 1 of the third embodiment is different from that of the first embodiment in that a dichroic mirror 6D is formed between the glass sealing portion 6 and the phosphor film 6B such that it prevents the re-entering of light radiated from the phosphor to the glass sealing portion 6.
(Details of the Components)

The dichroic mirror 6D is formed by laminating alternately $TiO_2$ film and $SiO_2$ film and severs to transmit light of less than 500 nm and to reflect light of more than 500 nm. Thus, the dichroic mirror 6D can transmit blue light of 470 nm emitted from the LED element 2 and reflect yellow light radiated from the phosphor of the phosphor film 6B to prevent the re-entering thereof to the glass sealing portion 6.
(Effects of the Third Embodiment)

In the third embodiment, the brightness can be enhanced in addition to the effects of the first embodiment since the dichroic mirror 6D is provided between the glass sealing portion 6 and the phosphor film 6B. Namely, it can be prevented that the yellow light radiated from the phosphor film 6B is re-entered to the glass sealing portion 6 and absorbed in the LED element 2 to reduce the light extraction efficiency of the LED 1.

Further, since the $TiO_2$ film and $SiO_2$ film also are a humidity-resistant coating material, the humidity resistance of the device can be further enhanced.

Fourth Embodiment

The fourth embodiment is constructed such that the phosphor film 6B is formed by sputtering on the optical-shaped portion 6A of the LED 1 as described in the third embodiment.
(Effects of the Fourth Embodiment)

In the fourth embodiment, by forming the phosphor film 6B by sputtering, the phosphor film 6B can have a high phosphor concentration with high accuracy and, therefore, can have the same effects as the third embodiment. As compared to the third embodiment, yellow light generated from the phosphor film 6B is more likely to be radiated to the direction of the glass sealing portion 6 due to the high phosphor concentration. However, since the dichroic mirror 6D can reflect the yellow light being radiated to the direction of the glass sealing portion 6, the mixing of the yellow light and blue light can be promoted to obtain white light without unevenness in emission color.

Fifth Embodiment

Figure 5A:
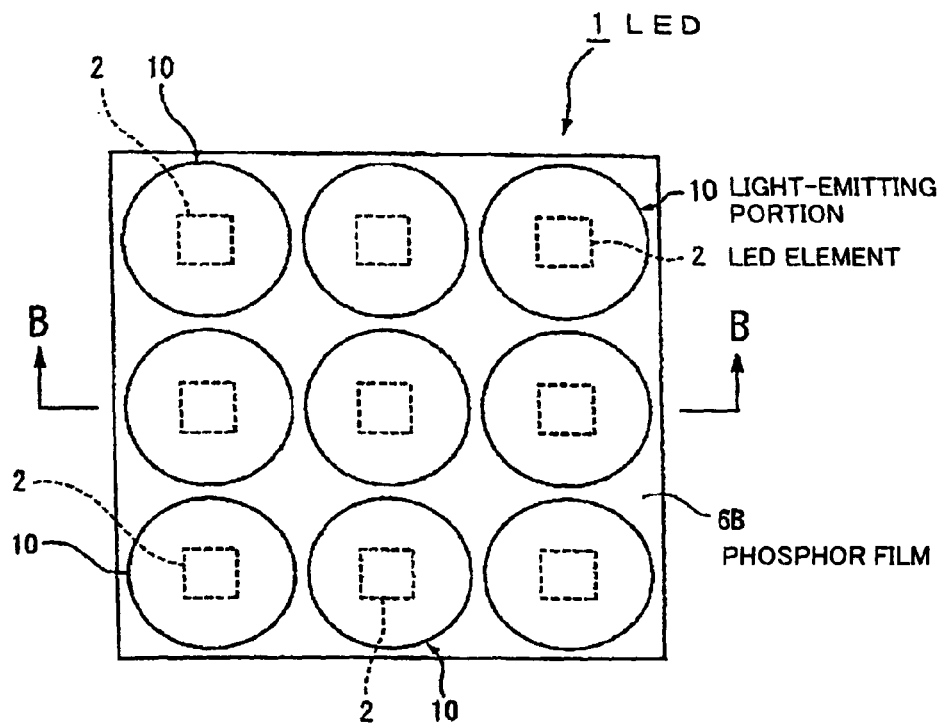
FIG. 5A is a plain view showing an LED in a fifth preferred embodiment according to the invention.
Figure 5B:
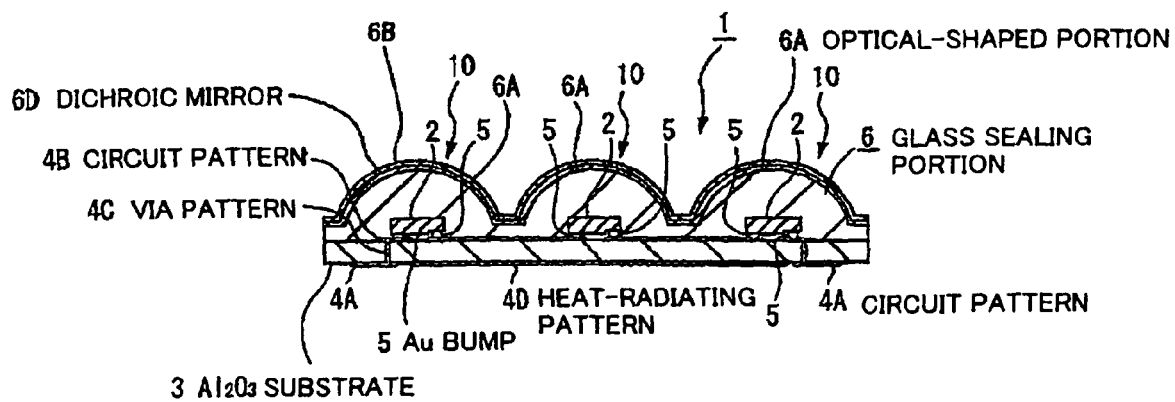
FIG. 5B is a cross sectional view cut along a line B-B in FIG. 5A.

FIG. 5A is a plain view showing an LED in the fifth preferred embodiment according to the invention. FIG. 5B is a cross sectional view cut along a line B-B in FIG. 5A.
(Components of the Device)

The fifth embodiment is different from the third embodiment in that the LED 1 is provided with plural light-emitting portions 10 of 9=3×3 which have as a light source a ultraviolet LED element 2 with a central emission wavelength of 370 nm formed on the $Al_2O_3$ substrate 3, the dichroic mirror 6D is formed covering the surface of the plural light-emitting portions 10, and the phosphor film 6B is further formed on the surface.
(Details of the Components)

The $Al_2O_3$ substrate 3 is provided with a heat-radiating pattern 4D that is made of copper foil and allows heat generated from the plural LED elements 2 to be radiated outside of the substrate.

The phosphor film 6B contains R, G and B phosphors at a predetermined ratio to be excited by ultraviolet light emitted from the LED element 2, and it radiates white light based on the mixing of R, G and B visible lights generated by being excited.

The dichroic mirror 6D is formed by laminating alternately $Ta_2O_5$ film and $SiO_2$ film and severs to transmit ultraviolet light emitted from the LED element 2 and to reflect the R, G and B visible lights radiated from the phosphor film 6B to prevent the re-entering thereof to the glass sealing portion 6.
(Effects of the Fifth Embodiment)

In the fifth embodiment, the plural light-emitting portions 10 are formed on the $Al_2O_3$ substrate 3 with the ultraviolet LED element 2 having high emission efficiency and the phosphor film 6B containing the R, G and B phosphors. Therefore, the LED 1 can radiate white light with a color rendering property at high brightness, in addition to the effects of the third embodiment.

Further, even when the ultraviolet LED element 2 is used, the sealing material does not deteriorate since the LED 1 is sealed with the glass sealing portion 6. Thus, the LED 1 can have a high reliability over a long term while using the ultraviolet LED element 2 with the high emission efficiency as a light source.

Although the LED 1 of the fifth embodiment has the nine light-emitting portions 10 formed on the $Al_2O_3$ substrate 3, the number of the light-emitting portions 10 may be changed.

Sixth Embodiment

Figure 6A:
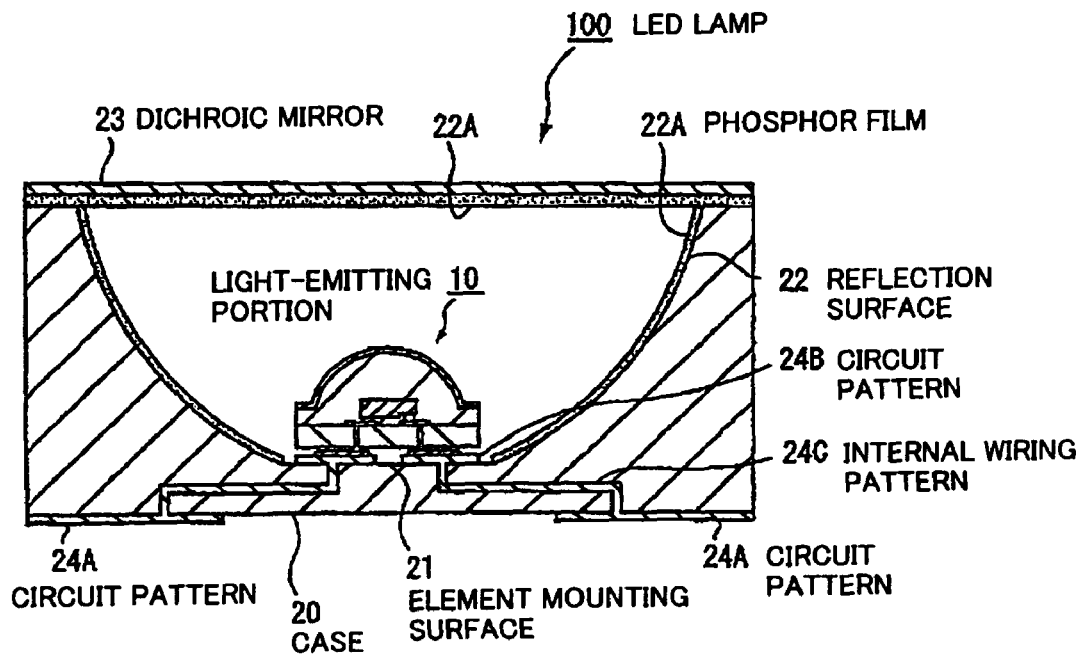
FIG. 6A is a cross sectional view showing an LED lamp in a sixth preferred embodiment according to the invention.
Figure 6B:
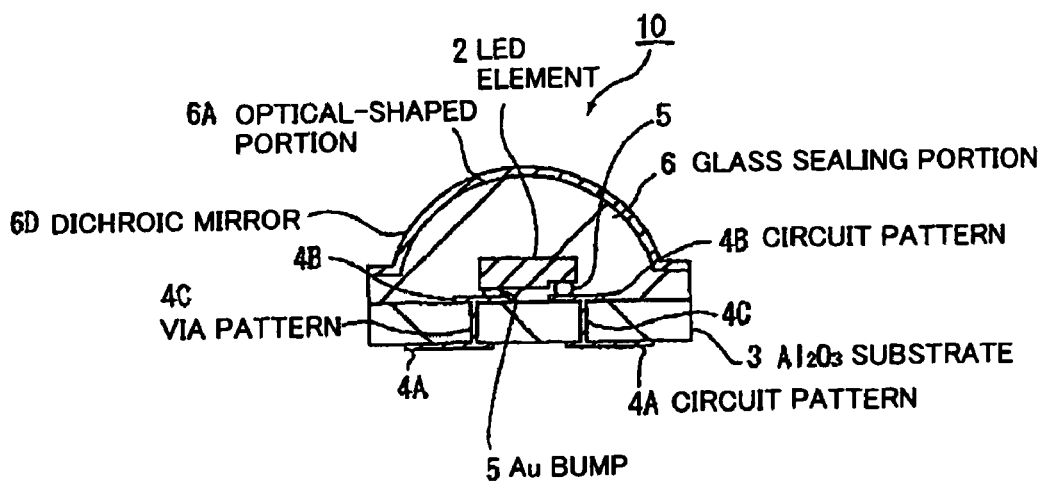
FIG. 6B is a cross sectional view showing a light-emitting portion mounted on the LED lamp in FIG. 6A.

FIG. 6A is a cross sectional view showing an LED lamp in the sixth preferred embodiment according to the invention. FIG. 6B is a cross sectional view showing a light-emitting portion mounted on the LED lamp in FIG. 6A.
(Components of the Device)

The LED lamp 100 comprises a case 20 made of nylon resin, a light-emitting portion 10 mounted on an element mounting surface 21 formed at the bottom of a concave portion of the case 20, a phosphor film 22A, which covers an opening of the case 20 and contains R, G and B phosphors, and a dichroic mirror 23 which is laminated on the phosphor film 22A. The dichroic mirror 23 serves to transmit visible light and to reflect ultraviolet light. The light-emitting portion 10 comprises the ultraviolet LED element 2 as a light source, and the dichroic mirror 6D formed on the optical-shaped portion 6A to transmit visible light and to reflect ultraviolet light.

The case 20 comprises a reflection surface 22 formed curved from the element mounting surface 21 to the opening of the case 20, a circuit pattern 24A formed on the bottom of the case 20 for external circuit connection, a circuit pattern 24B formed on the element mounting surface 21 for the mounting of the light-emitting portion 10, and an internal wiring pattern 24C to connect between the circuit pattern 24A and the circuit pattern 24B.

(Operation of the LED Lamp 100)

The operation of the sixth embodiment will be described below.

When current is fed through the circuit pattern 24A from a power supply (not shown), the light-emitting layer is current-fed through the electrode of the LED element 2. Thereupon, the light-emitting layer emits blue light. The blue light is inputted from the GaN-based semiconductor layer through the sapphire substrate to the glass sealing portion 6, reaching the optical-shaped portion 6A. The blue light reaching the optical-shaped portion 6A is then transmitted through the dichroic mirror 6D, radiated outside of the light-emitting portion 10.

Light radiated laterally from the light-emitting portion 10 is inputted to the phosphor film 22A formed on the reflection surface 22, exciting the R, G and B phosphors therein and then reflected in directions according to the curved face of the reflection surface 22. The reflected light is mixed with ultraviolet light transmitted through the dichroic mirror 6D of the light-emitting portion 10 to generate visible light. The visible light is transmitted through the dichroic mirror 23 and radiated outside of the case 20.

On the other hand, light radiated upward from the optical fiber main body 10 is inputted to the phosphor film 22A covering the case 20, exciting the R, G and B phosphors therein. Excited light radiated from the R, G and B phosphors is mixed with ultraviolet light transmitted through the dichroic mirror 6D of the light-emitting portion 10 to generate visible light. The visible light is transmitted through the dichroic mirror 23 and radiated outside of the case 20.

(Effects of the Sixth Embodiment)

In the sixth embodiment, although the phosphor film 22A is formed on the side of the case 20 while being separated from the light-emitting portion 10, the LED lamp 100 can have high brightness and reliability without unevenness in emission color.

The ultraviolet LED element 2 may be replaced by the blue LED element 2 and the R, G and B phosphors contained in the phosphor film 22A may be replaced by a yellow phosphor such as YAG. Thereby, white light can be radiated outside of the LED lamp 100.

Seventh Embodiment

Figure 7:
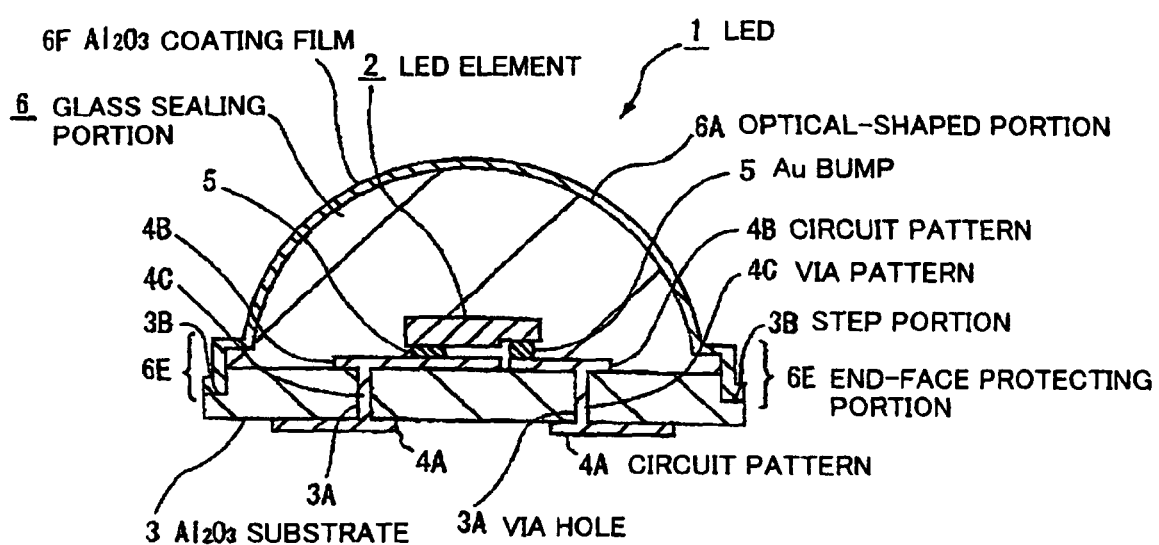
FIG. 7 is a cross sectional view showing a light emitting device in a seventh preferred embodiment according to the invention.

FIG. 7 is a cross sectional view showing a light emitting device in the seventh preferred embodiment according to the invention.

(Components of the Device)

As shown in FIG. 7, the LED 1 comprises: a flip-chip type LED element 2; an $Al_2O_3$ substrate 3, as an inorganic material substrate, provided with circuit patterns 4A, 4B, and via holes 3A; an Au bump 5 to electrically connect between the circuit pattern 4B and an electrode of the LED element 2; and a glass sealing portion 6 that is made of an inorganic sealing material to seal the $Al_2O_3$ substrate 3 and the LED element 2.

(Details of the Components)

The LED element 2 comprises, sequentially grown on an underlying sapphire substrate, an AlN buffer layer and a GaN-based semiconductor layer including an n-GaN layer, a light-emitting layer, and a p-GaN layer. It has a horizontal type electrode structure that a part of the n-GaN layer is exposed as an n-electrode formation region by etching the p-GaN layer through the n-GaN layer. It is flip-chip mounted on the circuit pattern 4B through the Au bump 5. The LED element 2 has a central emission wavelength of about 470 nm and a thermal expansion coefficient of $7 \times 10^{-6}/°C$. The ratio of the width of the LED 1 and the width of the LED element 2 is determined to be 1 or more and 5 or less.

The $Al_2O_3$ substrate 3 has a thermal expansion coefficient of $7 \times 10^{-6}/°C.$, which is nearly equivalent to that of the LED element 2. It is provided with the circuit patterns 4A, 4B and the via pattern 4C which are made of tungsten (W)-nickel (Ni)-gold (Au) on its element mounting surface, via hole 3A and bottom surface. Further, it is provided with a step portion 3B at a portion corresponding to an outer edge of the LED 1.

The glass sealing portion 6 is made of low-melting glass which can be processed by hot pressing at a low melting point of 600° C. or less, and it has a thermal expansion coefficient ($7 \times 10^{-6}/°C.$) nearly equivalent to that of the LED element 2 and the $Al_2O_3$ substrate 3. It is, on its surface, provided with the optical-shaped portion 6A which is formed semispherical, and an $Al_2O_3$ coating film 6F which is formed on the surface of the optical-shaped portion 6A.

The $Al_2O_3$ coating film 6F is formed by sputtering $Al_2O_3$ on the surface of the optical-shaped portion 6A and then drying it. The $Al_3O_3$ coating film 6F is provided with an end-face protecting portion 6E which covers the end face of the glass sealing portion 6 and the step portion 3B.

(Method of Making the LED 1)

A method of making the LED 1 of the seventh embodiment will be described below.

Figure 8A:
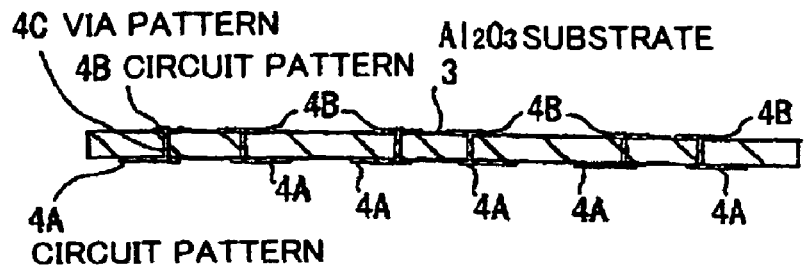
FIG. 8A to 8C are cross sectional views showing a wiring formation step to a glass preparation step in a method of making the LED in FIG. 7.
Figure 8B:
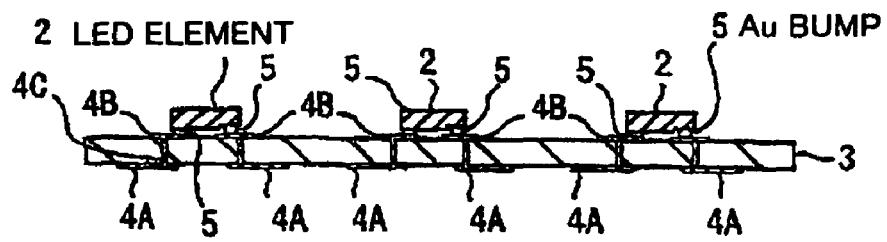
Figure 8C:
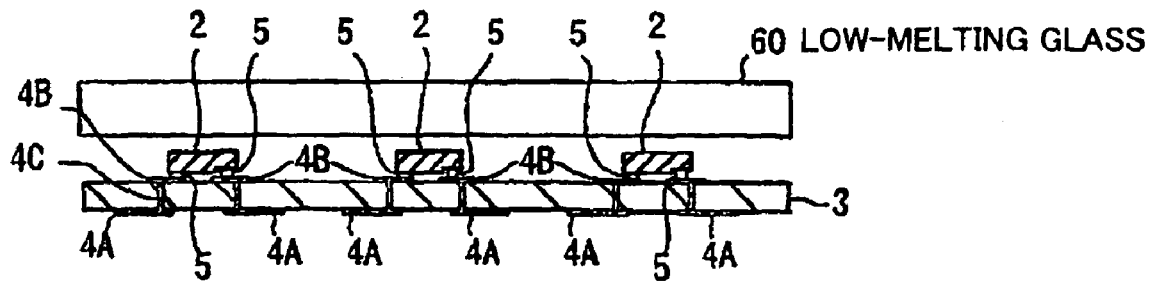

FIG. 8A to 8C are cross sectional views showing a wiring formation step to a glass preparation step in the method of making the LED in FIG. 7. FIG. 9A to 9D are cross sectional views showing a glass sealing step to an LED separation step in the method of making the LED in FIG. 7.

(Wiring Formation Step)

As shown in FIG. 8A, a W paste is screen-printed on the $Al_2O_3$ substrate 3 according to the circuit pattern. Then, the $Al_2O_3$ substrate 3 with the w paste printed thereon is heated at 1500° C. to burn the W onto the $Al_2O_3$ substrate 3. Then, Ni plating and Au plating are provided on the W to form the circuit patterns 4A, 4B and the via pattern 4C.

(LED Element Mounting Step)

Then, as shown in FIG. 8B, the LED element 2 is flip-mounted through the Au bump 5 on the circuit pattern 4B of the $Al_2O_3$ substrate 3.

(Low-Melting Glass Preparation Step)

Then, as shown in FIG. 8C, a plate-like $P_2O_5$—ZnO—$Li_2O$-based low-melting glass 60 is parallel placed over the $Al_2O_3$ substrate 3.

(Glass Sealing Step)

Figure 9A:
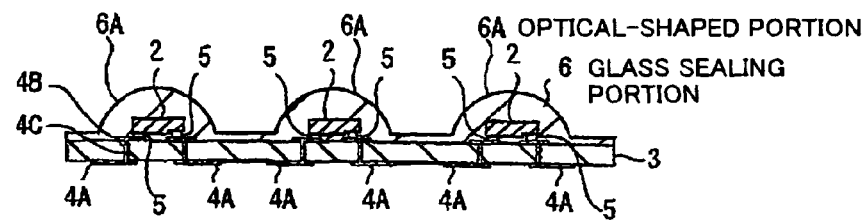
FIG. 9A to 9D are cross sectional views showing a glass sealing step to an LED separation step in the method of making the LED in FIG. 7.

Then, as shown in FIG. 9A, the low-melting glass 60 is hot-pressed at 550 to 500° C. in a nitrogen atmosphere. The low-melting glass 60 is bonded to the surface of the substrate through oxides contained in the $Al_2O_3$ substrate 3 and the glass, and the glass sealing portion 6 is molded to have the semispherical optical-shaped portion 6A according to the form of a pressing mold.

(Groove Formation Step)

Figure 9B:
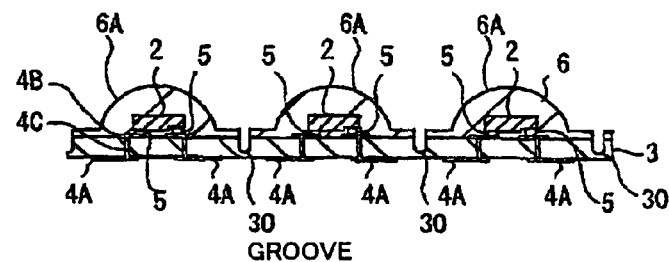

Then, as shown in FIG. 9B, a groove 30 is formed by half-cutting a thin portion of the glass sealing portion 6 by using a dicing saw. The groove 30 has such a depth that can prevent the separation of the $Al_2O_3$ substrate 3. In this state, the interface of the glass sealing portion 6 and the $Al_2O_3$ substrate 3 is exposed, and a part corresponding to the LED 1 is, in plain view thereof, surrounded by the groove 30 as a cutting face.

(Coating Film Formation Step)

Figure 9C:
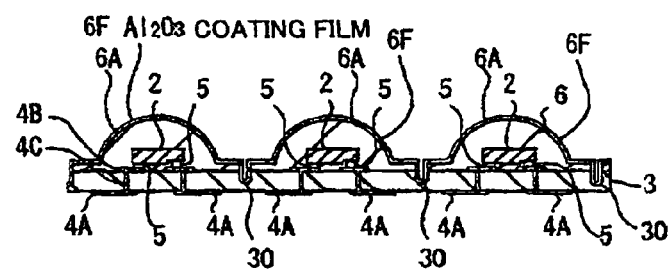

Then, as shown in FIG. 9C, the $Al_2O_3$ coating film 6F is formed by sputtering to cover the surface of the glass sealing portion 6. In this state, the entire surface of the part corresponding to the LED 1 surrounded by the groove 30 is covered with the $Al_2O_3$ coating film 6F.

(LED Separation Step)

Figure 9D:
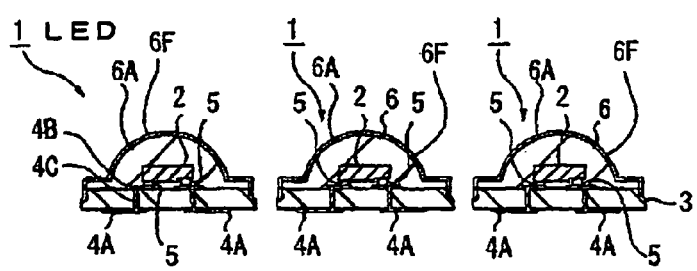

Then, as shown in FIG. 9D, the LED 1 is separated by cutting the $Al_2O_3$ substrate 3 along the groove 30. The LED 1 separated has the end face of the glass sealing portion 6 covered with the $Al_2O_3$ coating film.

(Operation of the LED 1)

The operation of the seventh embodiment will be described below.

When current is fed through the circuit pattern 4A from a power supply (not shown), the light-emitting layer is current-fed through the electrode of the LED element 2. Thereupon, the light-emitting layer emits blue light. The blue light is inputted from the GaN-based semiconductor layer through the sapphire substrate to the glass sealing portion 6, reaching the optical-shaped portion 6A. The blue light reaching the optical-shaped portion 6A is externally radiated through the $Al_2O_3$ coating film 6F.

(Effects of the Seventh Embodiment)

The effects of the seventh embodiment are as follows.

(1) After the LED element 2 is seal with glass, the grove 30 is formed penetrating through the glass sealing portion 6 into the $Al_2O_3$ substrate 3, and the $Al_2O_3$ coating film 6F is formed on the surface of the glass as well as the groove 30 to protect the surface of the glass. Therefore, even when the LED 1 is separated, the end face of the glass sealing portion 6 can be thereby protected without being exposed. Thus, even when the glass sealing portion 6 has a relatively low humidity resistance due to its restrictions such as reduction in glass melting point, adjustment in thermal expansion coefficient or refractive index etc., the glass sealing portion 6 can be stably used over a long term without deteriorating under high temperature and humidity environment.

Further, since the $Al_2O_3$ coating film 6F is formed by sputtering, it can be easy formed in the groove 30.

(2) Since moisture does not penetrate through between the glass sealing portion 6 and the $Al_2O_3$ substrate 3 due to the $Al_2O_3$ coating film 6F, reduction in bonding strength between the glass sealing portion 6 and the $Al_2O_3$ substrate 3 can be prevented.

(3) Since the groove 30 is formed by the half-cutting with the dicing saw after the formation of the glass sealing portion 6, the LED 1 can be easy separated after the formation of the $Al_2O_3$ coating film 6F. Thus, the productivity can be enhanced.

Although in the seventh embodiment the $Al_2O_3$ coating film 6F is formed on the surface of the glass sealing portion 6, the coating film 6F may be made of $SiO_2$, SiN, $MgF_2$ etc. other than $Al_3O_3$.

Although in the seventh embodiment the groove 30 is formed by using the dicing saw, the groove 30 may be formed by laser light. The laser processing allows reduction in process time and enhancement in productivity. Especially short-time pulse irradiation such as femtosecond laser pulse allows the formation of a smooth-faced groove.

It is confirmed by experiments that glass can be well bonded to the $Al_2O_3$ when it has a thermal expansion coefficient of $6.0 \times 10^{-6}/°$ C. to $7.7 \times 10^{-6}/°$ C. Although the bonding strength depends on the size, melting characteristic and stress direction of glass, it does not always need to have a difference in thermal expansion coefficient within a few %. Thus, even when the difference is about 15%, it only has to have a sufficient bonding strength.

Eighth Embodiment

Figure 10:
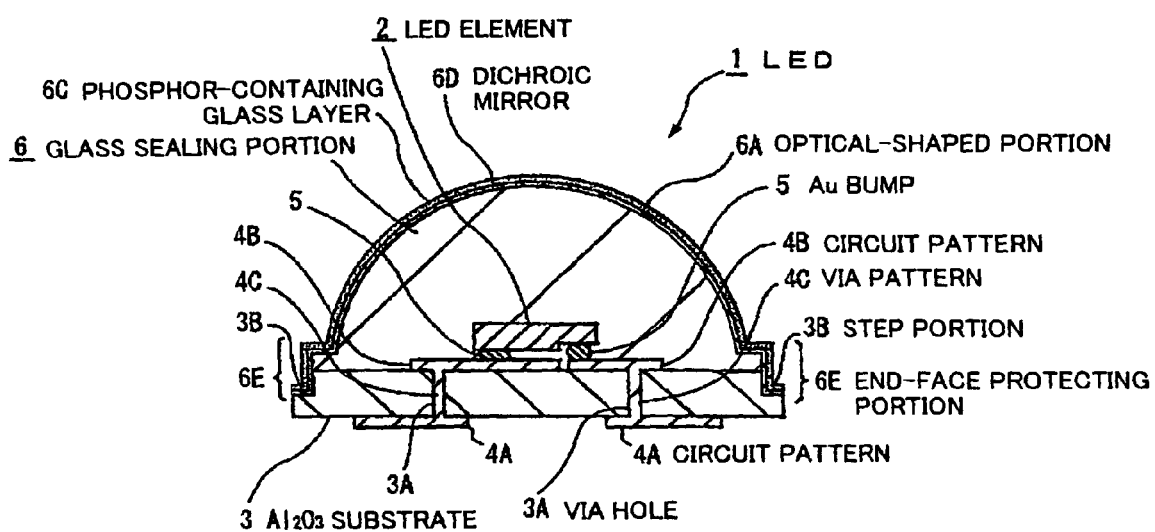
FIG. 10 is a cross sectional view showing a light emitting device in an eighth preferred embodiment according to the invention.

FIG. 10 is a cross sectional view showing a light emitting device in the eighth preferred embodiment according to the invention. Like components are indicated by the same numerals used in the seventh embodiment.

(Components of the Device)

The LED 1 of the eighth embodiment is different from that of the seventh embodiment in that a dichroic mirror 6D and a phosphor-containing glass layer 6C are used in place of the $Al_2O_3$ coating film 6F.

(Details of the Components)

The dichroic mirror 6D is formed by laminating alternately $TiO_2$ film and $SiO_2$ film and severs to transmit light of less than 500 nm and to reflect light of more than 500 nm. Thus, the dichroic mirror 6D can transmit blue light of 470 nm emitted from the LED element 2 and reflect yellow light radiated from the phosphor of the phosphor-containing glass layer 6C to prevent the re-entering thereof to the glass sealing portion 6.

The phosphor-containing glass layer 6C is made of a mixture material (with a melting point of about 300° C.) that a phosphor particle with an average outside diameter of 10 μm is mixed with a fluoride low-melting glass particle with an average outside diameter of 10 μm. The phosphor-containing glass layer 6C is formed integrally on the surface of the glass sealing portion 6 with the optical-shaped portion 6A by conducting the electrostatic coating of the mixture material while heating the glass sealing portion 6 at 300° C. and applying a voltage thereto and then heating it at 350° C. In this case, the phosphor used is to be excited by blue light emitted from the LED element 2. For example, the phosphor can be Ce:YAG (yttrium aluminum garnet) phosphor.

(Effects of the Eighth Embodiment)

In the eighth embodiment, since the dichroic mirror 6D and the phosphor-containing glass layer 6C are formed on the entire surface of the glass sealing portion 6, unevenness in emission color can be suppressed.

Further, since it is glass-sealed, the electrostatic coating can be conducted by applying the voltage thereto while heating it. Further, since the mixture material of the phosphor particle and the fluoride low-melting glass particle is electrostatically adhered to the surface of the glass sealing portion 6, an effect other than the effects of the seventh embodiment can be obtained that the mixture material can be, with a uniform film thickness, adhered to the uneven surface of the glass sealing portion 6 and the phosphor-containing glass layer 6C with a uniform thickness can be easy formed by fusion bonding.

Further, since the fluoride coating of fluoride low-melting glass is formed on the surface of the glass sealing portion 6, the humidity resistance of the LED 1 can be further enhanced.

Ninth Embodiment

Figure 11:
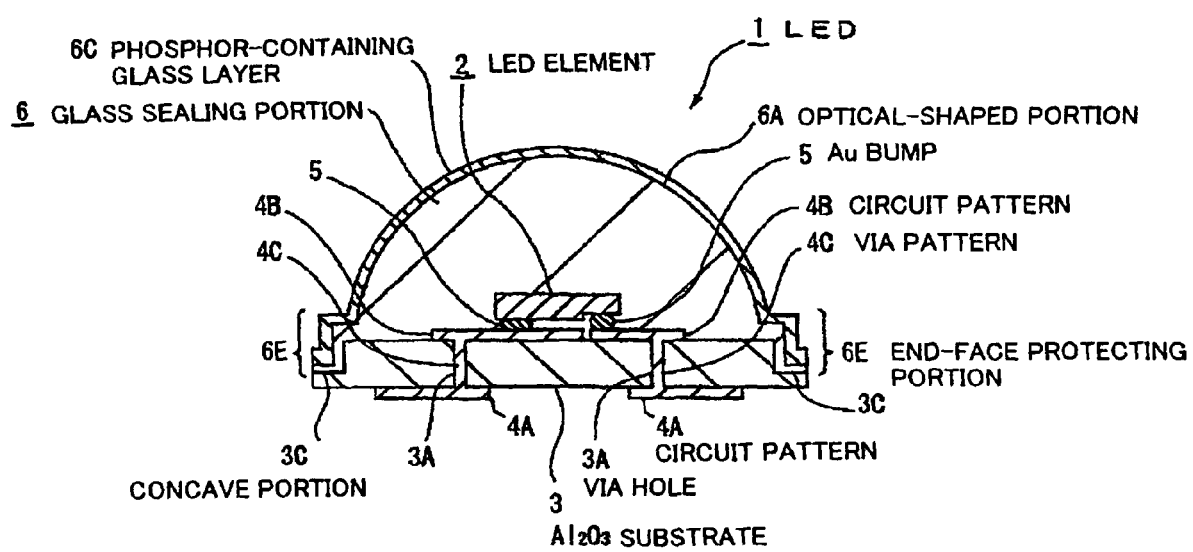
FIG. 11 is a cross sectional view showing a light emitting device (LED) in a ninth preferred embodiment according to the invention.

FIG. 11 is a cross sectional view showing a light emitting device (LED) in the ninth preferred embodiment according to the invention.

(Components of the Device)

The LED 1 of the ninth embodiment is different from that of the seventh or eighth embodiment in that it is provided with the $Al_2O_3$ substrate 3 having a concave portion 3C with a height different from the element mounting surface, the glass sealing portion 6 is formed covering the concave portion 3C as well as the $Al_2O_3$ substrate 3 and the LED element 2, and that it is provided with only the phosphor-containing glass layer 6C instead of the $Al_2O_3$ coating film 6F and the dichroic mirror 6D.

(Details of the Components)

The glass sealing portion 6 is formed by hot pressing to cover the concave portion 3C as well as having the optical-shaped portion 6A. The phosphor-containing glass layer 6C as described in the eighth embodiment is formed on the surface of the glass sealing portion 6.

(Method of Making the LED 1)

A method of making the LED 1 of the ninth embodiment will be described below.

Figure 12A:
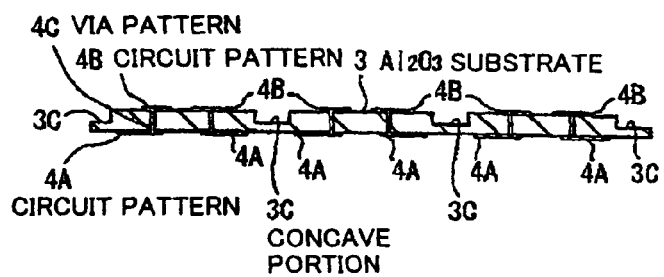
FIG. 12A to 12C are cross sectional views showing a wiring formation step to a glass preparation step in a method of making the LED in FIG. 11.
Figure 12B:
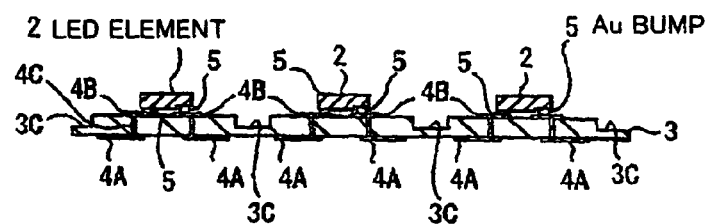
Figure 12C:
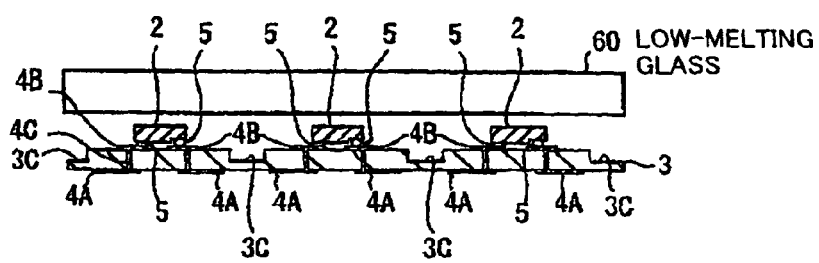
Figure 13A:
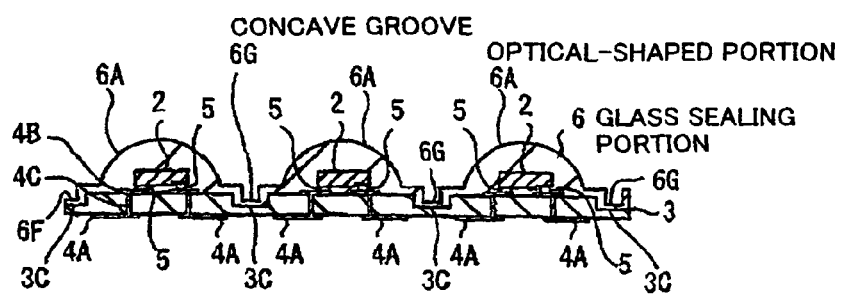
FIG. 13A to 13C are cross sectional views showing a glass sealing step to an LED separation step in the method of making the LED in FIG. 11.
Figure 13B:
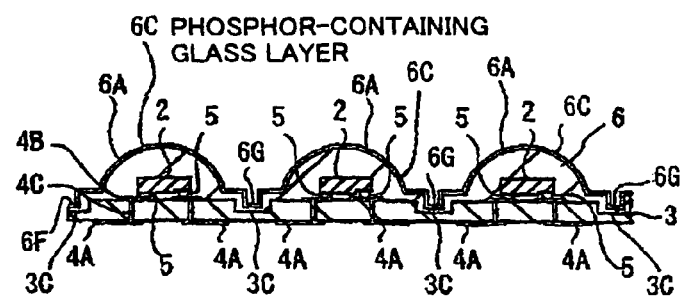
Figure 13C:
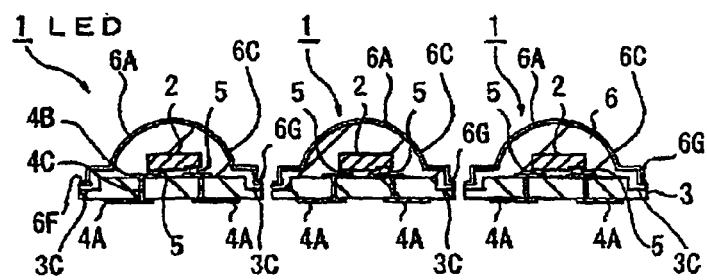

FIG. 12A to 12C are cross sectional views showing a wiring formation step to a glass preparation step in the method of making the LED in FIG. 11. FIG. 13A to 13C are cross sectional views showing a glass sealing step to an LED separation step in the method of making the LED in FIG. 11.

(Wiring Formation Step)

As shown in FIG. 12A, a W paste is, according to the circuit pattern, screen-printed on the $Al_2O_3$ substrate 3. Then, the $Al_2O_3$ substrate 3 with the W paste printed thereon is heated at 1500° C. to burn the W onto the $Al_2O_3$ substrate 3. Then, Ni plating and Au plating are provided on the W to form the circuit patterns 4A, 4B and the via pattern 4C. The concave portion 3C is formed by cutting or sand-blasting after the formation of the circuit patterns 4A, 4B and the via pattern 4C. Alternatively, it may be formed before the formation.

(LED Element Mounting Step)

Then, as shown in FIG. 12B, the LED element 2 is flip-mounted through the Au bump 5 on the circuit pattern 4B of the $Al_2O_3$ substrate 3.

(Low-Melting Glass Preparation Step)

Then, as shown in FIG. 12C, a plate-like $P_2O_5$—ZnO—$Li_2O$-based low-melting glass 60 is parallel placed over the $Al_2O_3$ substrate 3.

(Glass Sealing Step)

Then, as shown in FIG. 13A, the low-melting glass 60 is hot-pressed at 550 to 500° C. in a nitrogen atmosphere. The low-melting glass 60 is bonded to the surface of the substrate through oxides contained in the $Al_2O_3$ substrate 3 and the glass, and the glass sealing portion 6 is molded to have the semispherical optical-shaped portion 6A according to the form of a pressing mold. In this stage, the glass sealing portion 6 is provided with a concave groove 6G which is a thin portion corresponding to the concave portion 3C.

(Coating Film Formation Step)

Then, as shown in FIG. 13B, the phosphor-containing glass layer 6C is formed.

(LED Separation Step)

Then, as shown in FIG. 13C, the LED 1 is separated by cutting the substrate along the concave groove 6G by using a dicer.

(Effects of the Ninth Embodiment)

In the ninth embodiment, the $Al_2O_3$ substrate 3 with the concave portion 3C formed thereon is sealed with the low-melting glass 60, the low-melting glass 60 is concave-convex sealed in close contact with the side face of the concave portion 3C based on internal stress to be generated by heat contraction of the low-melting glass 60. Thus, since the glass sealing portion 6 is in close contact with the glass sealing portion 6 at the edge of the LED 1, the separation of glass or the penetration of moisture can be very effectively prevented.

Although in the ninth embodiment the glass sealing portion 6 is slightly exposed at the end-face protecting portion 6E, the optical influence thereof is negligible such that unevenness in emission color does not occur since light emitted from the LED element 2 does not reach directly this portion. Meanwhile, in this case, the glass sealing portion 6 is desirably of a material with high humidity resistance.

Optionally, the $Al_2O_3$ coating film may be formed in addition to the phosphor-containing glass layer 6C. Glass may be clouded at its surface in a high temperature and humidity environment. However, when the $Al_2O_3$ coating film is formed on the glass surface that light emitted from the LED element 2 reaches directly, the optical characteristics do not change.

Tenth Embodiment

FIG. 14A to 14D are cross sectional views showing a glass sealing step to an LED separation step in a method of making a concave groove in an LED in the tenth preferred embodiment according to the invention.

(Components of the Device)

The tenth embodiment is constructed such the glass sealing portion 6 is prevented from being exposed at the concave portion 3C as described in the ninth embodiment.

(Method of Making the Device)

The method of making the concave groove in the LED will be described below.

(Glass Sealing Step)

Figure 14A:
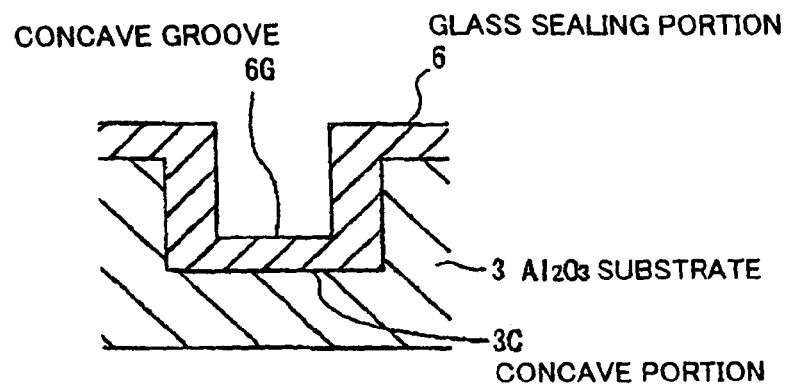
FIG. 14A to 14D are cross sectional views showing a glass sealing step to an LED separation step in a method of making a concave groove in an LED in a tenth preferred embodiment according to the invention.

As shown in FIG. 14A, the glass sealing step is conducted such that the concave groove 6G corresponding to the concave portion 3C has a groove width not to disturb the groove shaping process as described later. The other process is the same as described in the glass sealing step in FIG. 13A.

(Groove Formation Step)

Figure 14B:
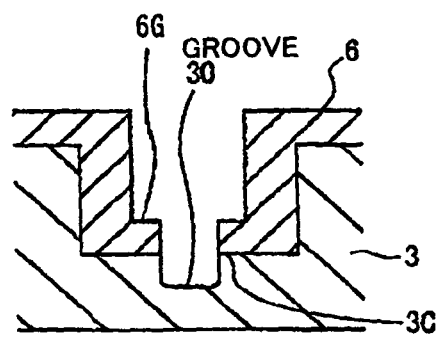

As shown in FIG. 14B, the groove formation step is conducted such that the groove 30 is formed by irradiating laser light to the concave groove 6G of the glass sealing portion 6 to allow the $Al_2O_3$ substrate 3 to be exposed. Instead of the irradiation of the laser light, the dicing with a dicer may be conducted to form the groove 30 with a depth reaching the $Al_2O_3$ substrate 3.

(Coating Film Formation Step)

Figure 14C:
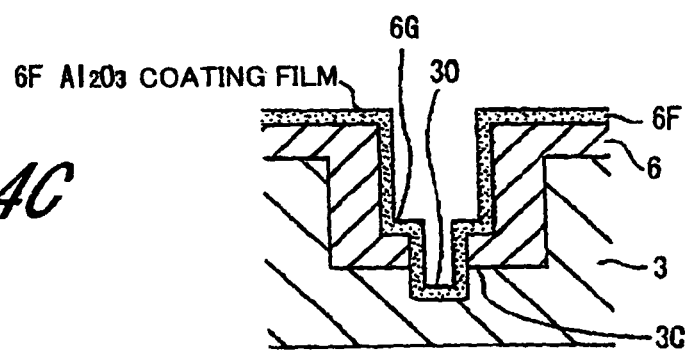

As shown in FIG. 14C, the coating film formation step is conducted such that the $Al_2O_3$ coating film 6F is formed covering the $Al_2O_3$ substrate 3 exposed in the groove formation step so as to coat the concave groove 6G exposed by the irradiation of the laser light.

(LED Separation Step)

Figure 14D:
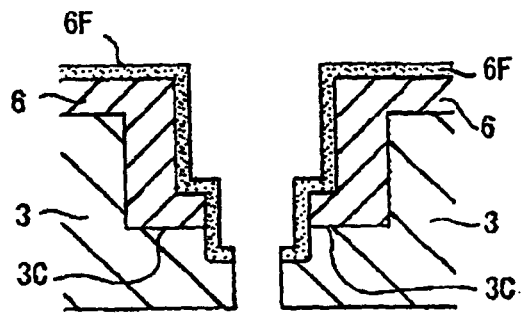
Figure 15:
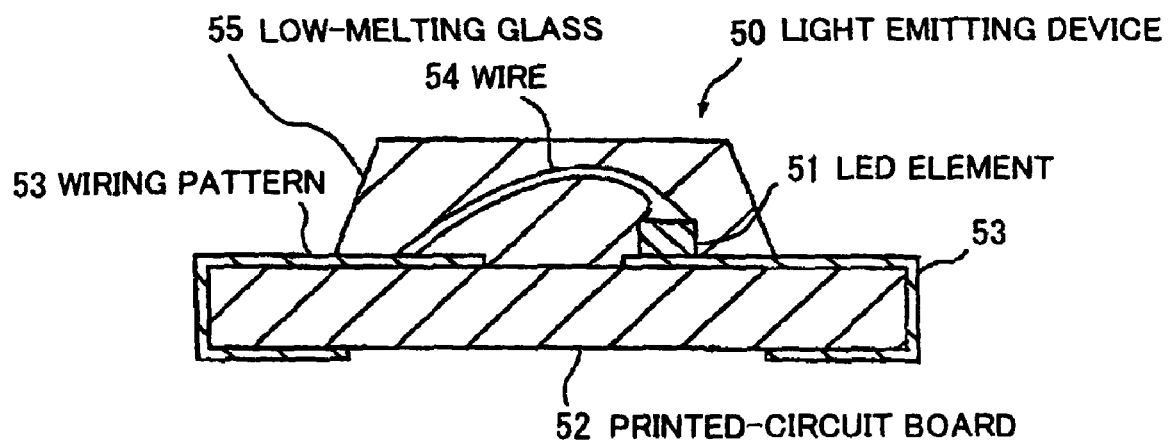
FIG. 15 is a cross sectional view showing the conventional light emitting device in JP-A-11-177129.

As shown in FIG. 14D, the LED separation step is conducted such that LED 1 is individually separated by cutting the substrate at the groove 30 by a dicer after the coating film formation step. The end-face of the separated LED 1 is concave-convex sealed with the glass sealing portion 6 at the concave portion 3C of the $Al_2O_3$ substrate 3, and the interface of the glass sealing portion 6 and the $Al_2O_3$ substrate 3 is sealed with the $Al_2O_3$ coating film 6F.

(Effects of the Tenth Embodiment)

In the tenth embodiment, the $Al_2O_3$ substrate 3 with the concave portion 3C is glass-sealed with the low-melting glass 60, and the groove 30 formed at the glass-sealed concave portion 3C is coated with the $Al_2O_3$ coating film 6F. Therefore, a high bonding strength can be obtained between the $Al_2O_3$ substrate 3 and the glass sealing portion 6 based on the heat contraction of the low-melting glass. Further, a high humidity resistance and deterioration resistance can be obtained by thus protecting the entire surface of the glass sealing portion 6.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A method of making a light emitting device, comprising:
   mounting a light emitting element on a substrate;
   hot-pressing a glass material on the light emitting element to form a glass sealing portion for sealing the light emitting element; and
   forming a phosphor layer on a surface of the glass sealing portion.

2. The method according to claim 1, wherein the phosphor layer comprises a phosphor and an inorganic material.

3. The method according to claim 2, wherein the inorganic material comprises one of an acrylic coating material and glass material.

4. The method according to claim 1, wherein the light emitting element is flip-mounted.

5. The method according to claim 1, wherein the substrate comprises an inorganic material with a thermal expansion coefficient equivalent to a thermal expansion coefficient of the glass sealing portion.

6. The method according to claim 1, wherein the phosphor layer is formed so as to be disposed at a distance from a light extracting surface of the light emitting element and has a uniform thickness so as to prevent an unevenness in emission color.

7. The method according to claim 1, further comprising:
   forming a dichroic mirror between the glass sealing portion and the phosphor layer for passing through a light emitted from the light emitting element and reflecting a fluorescence emitted from the phosphor layer.

8. The method according to claim 7, wherein the dichroic mirror comprises a plurality of materials with different refractive indexes alternately laminated.

9. The method according to claim 1, wherein the phosphor layer has a thermal expansion coefficient greater than a thermal expansion coefficient of the glass sealing portion.

10. The method according to claim 1, wherein the phosphor layer comprises a low-melting fluoride glass.

11. The method according to claim 1, wherein the phosphor layer is formed by sputtering.

12. The method according to claim 1, wherein the phosphor layer is formed by electrostatic coating.

13. The method according to claim 3, wherein the acrylic coating material is coated on the surface of the glass sealing portion.

14. The method according to claim 10, wherein the forming of the phosphor layer comprises hot-pressing the low-melting fluoride glass in a nitrogen atmosphere.

15. The method according to claim 1, wherein the light emitting element emits light at substantially a same incident angle about a line perpendicular to the surface of the glass sealing portion.

16. The method according to claim 1, wherein the glass sealing portion comprises an inorganic sealing material.

17. The method according to claim 1, wherein the glass sealing portion comprises a low-melting glass.

18. The method according to claim 1, wherein the phosphor layer comprises a phosphor that is excitable by an emission wavelength of the light emitting element.

19. The method according to claim 1, wherein a thermal expansion coefficient of the glass sealing portion is equivalent to a thermal expansion coefficient of the light emitting element.

* * * * *